(12) United States Patent
Shimizu

(10) Patent No.: US 6,261,372 B1
(45) Date of Patent: Jul. 17, 2001

(54) VACUUM PROCESS SYSTEM

(75) Inventor: Masahiro Shimizu, Kofu (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/550,711

(22) Filed: Apr. 17, 2000

(30) Foreign Application Priority Data

Apr. 15, 1999 (JP) ................................. 11-108189

(51) Int. Cl.[7] ................................. C23C 16/00
(52) U.S. Cl. ................ 118/712; 118/715; 118/666; 156/345
(58) Field of Search ................ 118/715, 712, 118/666; 156/345

(56) References Cited

U.S. PATENT DOCUMENTS 4,887,548 * 12/1989 Urata ........................ 118/715

FOREIGN PATENT DOCUMENTS 59-3931 * 1/1984 (JP).
61-28443 * 2/1986 (JP) ........................ 118/722

* cited by examiner

*Primary Examiner*—Richard Bueker
(74) *Attorney, Agent, or Firm*—Finnegan, Henderson, Farabow, Garrett & Dunner L.L.P.

(57) ABSTRACT

A vacuum process system is equipped with a process vessel 1 for carrying out a vacuum process for an object S housed therein to be processed, using a process gas. A transparent window 2 is provided in the wall of the process vessel 1. Outside of the transparent window 2, there is arranged a radiation thermometer 3 for carrying out the thermometry of the object S in the process vessel 1 via the transparent window. A plurality of micro holes 22 for inhibiting a thin-film deposition are formed on the internal surface 20 of the transparent window 2 facing the interior of the process vessel 1.

5 Claims, 3 Drawing Sheets

VACUUM PROCESS SYSTEM

BACKGROUND OF THE INVENTION

1. Field of the Invention

The present invention relates generally to a vacuum process system equipped with a process vessel for carrying out a vacuum process, such as thin-film deposition or etching, for an object to be processed, such as a semiconductor substrate, using a process gas. More specifically, the invention relates to a vacuum process system designed to carry out optical measurement, such as thermometry using a radiation thermometer, of an object to be processed, from the outside via a transparent window provided in a vacuum process vessel.

2. Description of the Related Art

FIG. 4 schematically shows a typical vacuum process system, to which the present invention is applied. This vacuum process system is used for carrying out a vacuum process, such as thin-film deposition or etching, for a substrate S to be processed, such as a semiconductor substrate, using a process gas. In FIG. 4, the vacuum process system is equipped with a process vessel 1 for carrying out the vacuum process for the substrate S housed therein, using a process gas.

To the process vessel 1, a process gas is supplied from a predetermined gas supply means (not shown). The degree of vacuum in the process vessel 1 is held to be a degree of vacuum necessary for the process, by predetermined exhaust means (not shown).

The top of the process vessel 1 is provided with a transparent window 2. Outside of the transparent window 2, there is arranged a radiation thermometer (measuring device) 3 for carrying out the thermometry of the substrate S in the process vessel 1 via the transparent window 2. The radiation thermometer 3 is a kind of optical measuring system for measuring the temperature of an object on the basis of the quantity of thermal radiation from the object.

In the above described conventional vacuum process system, there is the following problem. That is, when the vacuum process, such as thin-film deposition or etching, for the substrate S in the process vessel 1 using the process gas is carried out, the thin-film deposition due to the action of the process gas proceeds on the internal surface of the transparent window 2 facing the interior of the process vessel 1.

By such progress of the thin-film deposition, the light transmittance of the transparent window 2 gradually decreases to deteriorate the precision of the optical thermometry for the substrate S using the radial thermometer 3 via the transparent window 2, so that there is the possibility that it is difficult to carry out the optical thermometry.

In particular, when a pre-coat process or the like for previously supplying a process gas into an empty process vessel 1 before the process to form a uniform thin film in the process vessel 1 is carried out in order to stabilize the state of a predetermined thin-film deposition or the like, the deterioration in the light transmittance of the transparent window 2 due to the thin-film deposition occurs from beginning, so that the above described problem becomes even more serious.

SUMMARY OF THE INVENTION

It is therefore an object of the present invention to eliminate the aforementioned problems and to provide a vacuum process system capable of holding the high precision of optical measurement for an object to be processed, using measuring device via a transparent window provided in a process vessel.

In order to accomplish the aforementioned and other objects, according to the present invention, there is provided a vacuum process system comprising: a process vessel, provided with a transparent window, for carrying out a vacuum process for an object, which is housed therein to be processed, using a process gas; and a measuring device, arranged outside of the transparent window, for carrying out an optical measurement for the object in the process vessel via the transparent window, wherein a plurality of micro holes for inhibiting a thin-film deposition are formed in the internal surface of the transparent window facing the interior of the process vessel.

According to such a vacuum process system, the thin-film deposition due to the action of the process gas can be inhibited in a portion, in which the micro holes are formed on the internal surface of the transparent window, so that the deterioration in the light transmittance of the transparent window due to the thin-film deposition can be inhibited. Therefore, the precision of the optical measurement for the object to be processed using the measuring device via the transparent window can be held to be high.

In the above described vacuum process system, each of the micro holes preferably has a dimension so as to cause a microloading effect. By such a microloading effect of the micro holes, the thin-film deposition on the bottoms of the micro holes can be effectively inhibited.

In this case, for example, if each of the micro holes has a diameter of 0.5 $\mu$m or less and if a ratio of a depth to the diameter of each of the micro holes is 5 or more, it is possible to obtain the microloading effect.

The measuring device may be a radiation thermometer for measuring the temperature of the object.

In this case, the process vessel may house therein a reflector having a predetermined reflectance in place of the object during a non-measurement using the radiation thermometer, and the radiation thermometer may comprise: a light emitting device for emitting irradiation light for the reflector during the non-measurement; a detector for detecting the intensity of light reflected from the reflector for the irradiation light emitted from the light emitting device during the non-measurement, and for detecting the quantity of thermal radiation from the object during a measurement; a transmittance calculator for calculating a light transmittance of the transparent window on the basis of the intensity of the irradiation light emitted from the light emitting device, the reflectance of the reflector, and the intensity of the reflected light detected by the detector; a detected value correcting system for correcting the quantity of thermal radiation detected by the detector, using the light transmittance calculated by the transmittance calculator; and a temperature calculator for calculating the temperature of the object on the basis of the quantity of thermal radiation corrected by the detected value correcting system.

In such a vacuum process system, during the non-measurement using the radiation thermometer, the reflector having the predetermined reflectance is housed in the process vessel in place of the object, to be radiated with light emitted from the light emitting device via the transparent window, and the detector detects the intensity of the reflected light from the reflector. Then, the transmittance calculator calculates the light transmittance of the transparent window on the basis of the intensity of the irradiation light emitted from the light emitting device, the reflectance of the reflector, and the intensity of the reflected light detected by the detector.

In addition, during the measurement using the radiation thermometer, the detector detects the quantity of thermal radiation from the object, and the detected value correcting system corrects the quantity of thermal radiation detected by the detector, using the light transmittance calculated by the transmittance calculator. Then, the temperature calculator calculates the temperature of the object on the basis of the quantity of thermal radiation corrected by the detected value correcting system.

That is, even if the above-described transparent window formed with the micro holes is used, it is difficult to completely prevent the deterioration in the light transmittance of the transparent window due to the thin-film deposition. However, if the thermometry is carried out by the above described detected value correcting system and the others in view of the deterioration in the light transmittance of the transparent window, the precision of the thermometry of the object can be held to be higher.

BRIEF DESCRIPTION OF THE DRAWINGS

The present invention will be understood more fully from the detailed description given hereafter and from the accompanying drawings of the preferred embodiments of the invention. However, the drawings are not intended to imply limitation of the invention to a specific embodiment, but are for explanation and understanding only.

In the drawings:

FIG. 1b is a bottom view of the principal part of the vacuum process system shown in FIG. 1a;

FIG. 2 is an enlarged longitudinal section showing a micro hole of a transparent window of the vacuum process system shown in FIG. 1a;

FIG. 3 is a block diagram showing a radiation thermometer of the vacuum process system shown in FIG. 1a.

DESCRIPTION OF THE PREFERRED EMBODIMENTS

Referring now to the accompanying drawings, a preferred embodiment of the present invention will be described below. FIGS. 1a through 3 show a preferred embodiment of a vacuum process system according to the present invention. Furthermore, the preferred embodiment of the present invention shown in FIGS. 1a through 3 will use the same reference numbers for the same elements as those in the typical vacuum process system shown in FIG. 4, and will be described referring to FIG. 4.

Furthermore, throughout the specification, the terms "transparent", "optical" and "light transmittance" mean to include those for electromagnetic waves (capable of passing through a transparent window 2), such as infrared rays, in addition to visible rays and for the transmission thereof.

The vacuum process system in this preferred embodiment is designed to carry out a vacuum process, such as thin-film deposition or etching, for a substrate (object) S to be processed, such as a semiconductor substrate or a liquid crystal display substrate, using a process gas. For example, as such a vacuum process, there is a process for forming a polysilicon thin film on a silicon substrate by the plasma CVD using a process gas mainly containing $SiH_4$.

Figure 4:
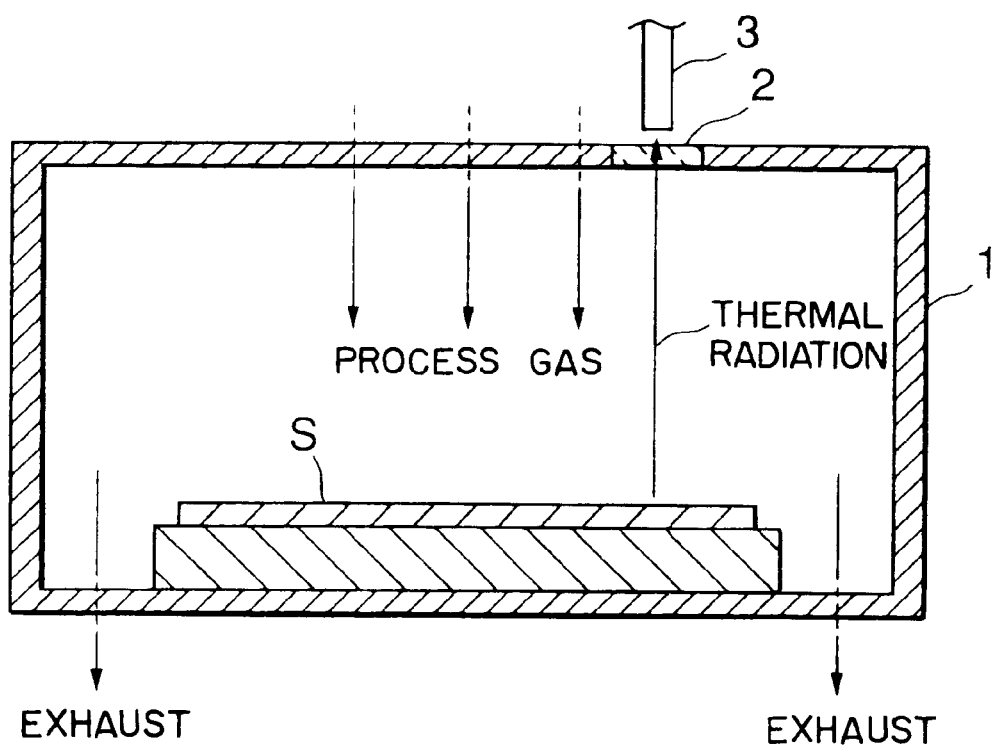
FIG. 4 is a longitudinal section schematically showing a typical vacuum process system, to which the present invention is applied.

In FIG. 4, the vacuum process system is equipped with a process vessel 1 for carrying out the vacuum process for the substrate S housed therein, using a process gas. To the process vessel 1, a process gas is supplied from a predetermined gas supply means (not shown). The degree of vacuum in the process vessel 1 is held to be a degree of vacuum necessary for the process, by predetermined exhaust means (not shown).

The top wall of the process vessel 1 is provided with a disk-shaped transparent window 2 of, e.g., quartz glass. Outside of the transparent window 2, there is arranged a radiation thermometer (measuring device) 3 for carrying out the thermometry of the substrate S in the process vessel 1 via the transparent window 2. The radiation thermometer 3 is a kind of optical measuring system for measuring the temperature of an object on the basis of the quantity (energy) of thermal radiation (usually infrared rays) emitted from the object.

Figure 1A:
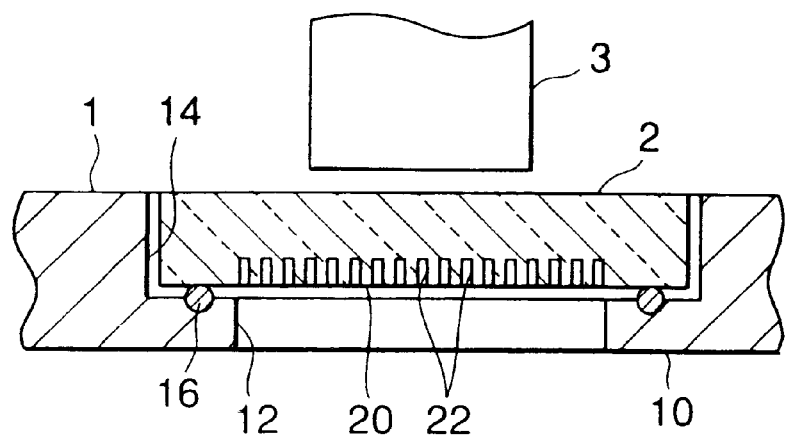
FIG. 1a is a longitudinal section showing a principal part of a preferred embodiment of a vacuum process system according to the present invention.

As shown in FIG. 1a, a cylindrical recessed portion 14 for mounting therein the transparent window 2 is formed in the external wall of the process vessel 1. In addition, an inside window opening 12, which is concentric with the recessed portion 14, is formed in the external wall of the process vessel 1 so as to extend from the bottom of the recessed portion 14 to the internal surface 10 of the process vessel 1. Between the bottom of the recessed portion 14 and the internal surface 20 of the transparent window 2, a ring-shaped sealing material 16 is mounted along the periphery of the inside window opening 12 so as to hold the gastightness of the process vessel 1.

Figure 1B:
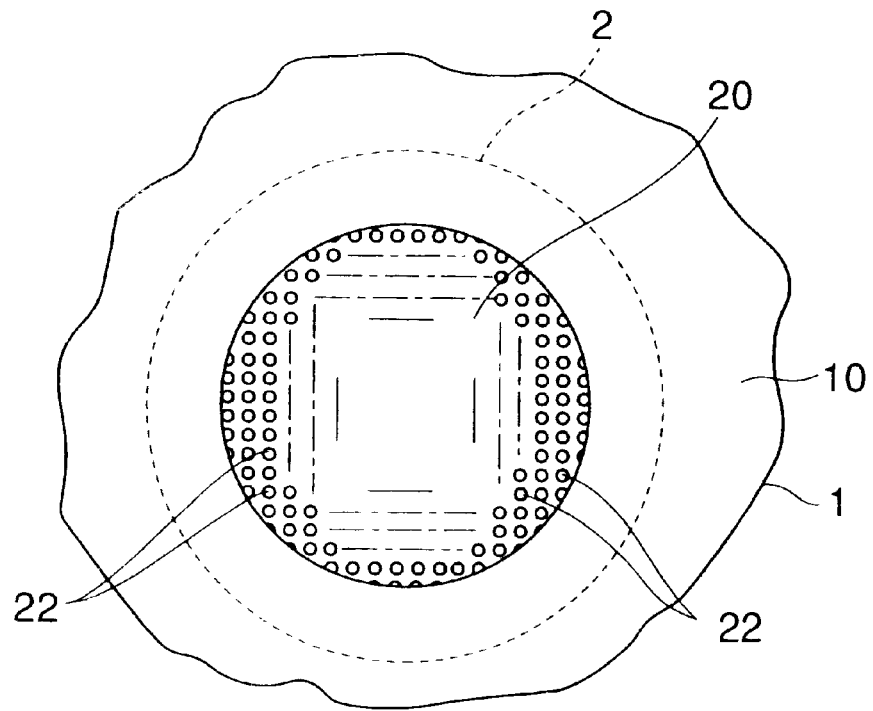

As shown in FIGS. 1a and 1b, the vacuum process system in this preferred embodiment is formed with a plurality of micro holes 22 for inhibiting thin-film deposition, on the internal surface 20 of the transparent window 2 facing the interior of the process vessel 1. Although the rate (rate of hole area) of the area occupied by the micro holes 22 to that of the internal surface 20 of the transparent window 2 (in a range corresponding to the inside window opening 12 of the process vessel 1) is preferably greater in view of the inhibiting effect of the thin-film deposition, the rate is set to be, e.g., about 50%, in view of restriction on work technique.

Figure 2:
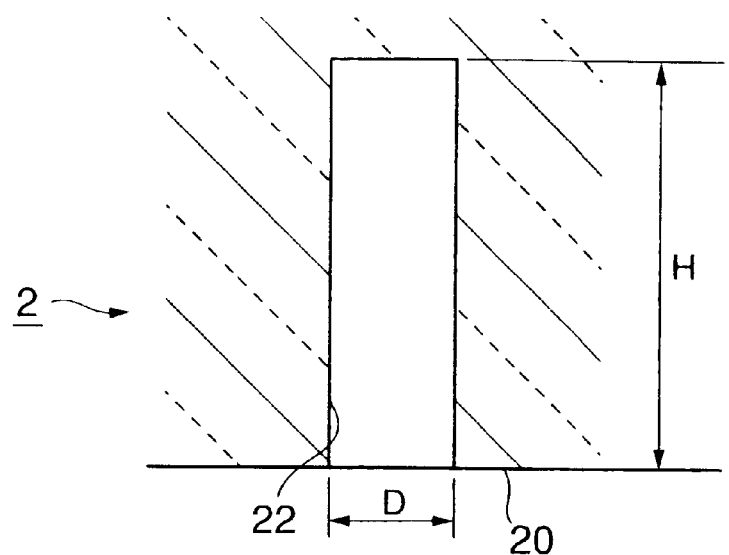

The elongated longitudinal section of one of the micro holes 22 is shown in FIG. 2. Each of the micro holes 22 is cylindrical, and the dimensions thereof are set so that the diameter D thereof is 0.5 $\mu$m or less and a ratio of a depth H to the diameter D (aspect ratio) is 5 or more. In processes for producing semiconductors, it is known that the process, such as etching or thin-film deposition, is not sufficiently carried out on the bottoms of the holes having such dimensions. This is called a microloading effect. Therefore, if the dimensions of the micro holes 22 are set so, the thin-film deposition is effectively inhibited, particularly on the bottoms of the micro holes 22, by the microloading effect.

Furthermore, if portions of the transparent window 2 other than the micro holes 22 are previously overcast by the thin-film deposition, the variation in quantity of light transmitting through the transparent window 2 can be inhibited when the vacuum process is carried out to some extent. In that case, the decrease of the quantity of transmitted light due to the overcast of the transparent window 2 can be inhibited by increasing the rate of hole area of the micro holes 22 to some extent.

Figure 3:
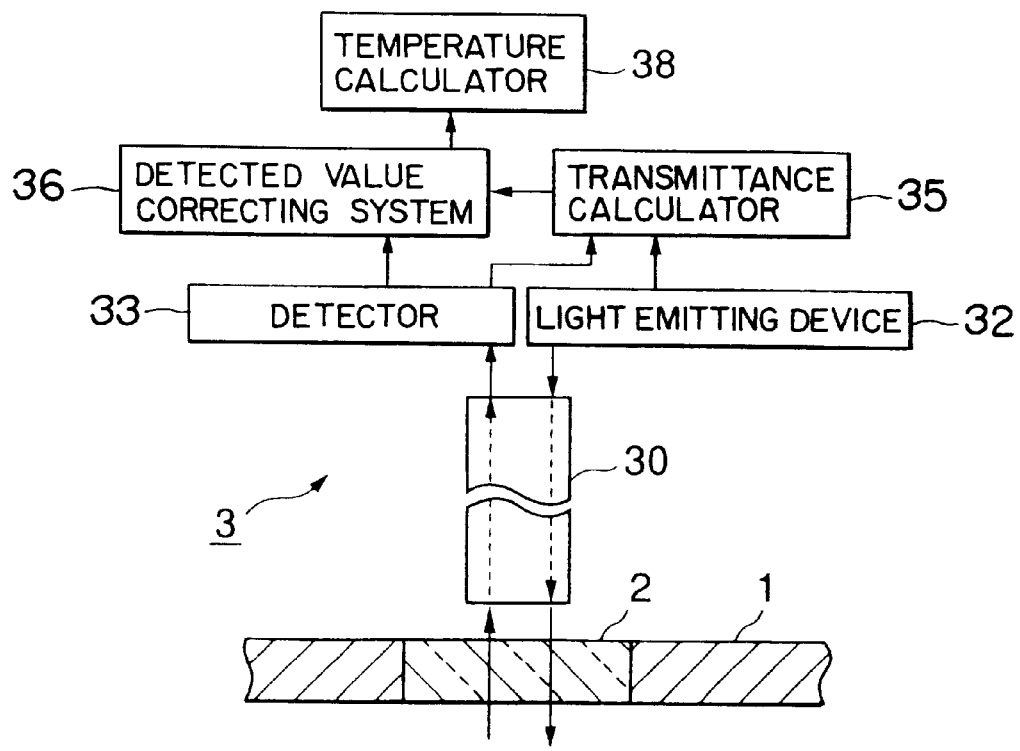

Referring to FIG. 3, the construction of the radiation thermometer 3 in this preferred embodiment will be described below.

In FIG. 3, the radiation thermometer 3 has a light emitting device 32, a detector 33 and a light guide 30. The light emitting device 32 is provided for emitting irradiation light for a reflector, which will be described later, during the non-measurement (correction) using the radiation thermometer 3. The detector 33 is provided for detecting the intensity of the light reflected from the reflector for the irradiation light emitted from the light emitting device 32 during the non-measurement and for detecting the quantity of thermal radiation from the substrate S during the measurement using the radiation thermometer 3.

The light guide 30 comprises, e.g., a bundle of optical fibers, and has the function of guiding the irradiation light emitted from the light emitting device 32, to the outside of the transparent window 2 to feed the irradiation light into the process vessel 1 via the transparent window 2. The light guide 30 also has the function of receiving the light reflected from the reflector for the irradiation light, or the thermal radiation (usually infrared rays) from the substrate S, outside of the transparent window 2 to guide them to the detector 33.

The radiation thermometer 3 also has a transmittance calculator 35, a detected value correcting system 36 and a temperature calculator 38. The transmittance calculator 35 is designed to calculate the light transmittance of the transparent window 2 on the basis of the intensity of the irradiation light emitted from the light emitting device 32, the reflectance of the reflector, and the intensity of the reflected light detected by the detector 33.

The detected value correcting system 36 is designed to correct the quantity of thermal radiation, which is detected by the detector 33, using the light transmittance calculated by the transmittance calculator 35. Specifically, assuming that the light transmittance of the transparent window 2 calculated by the transmittance calculator 35 is $\gamma$ and the quantity (energy) of thermal radiation of the substrate S detected by the detector 33 is E, the quantity E' of thermal radiation after correction is $E'=E/\gamma$. For example, when the light transmittance is $\gamma=0.80$ (80%), the quantity of thermal radiation after correction is $E'=E/\gamma=E/0.80=1.25\times E$.

The temperature calculator 38 is designed to calculate the temperature of the substrate S on the basis of the quantity of thermal radiation E' corrected by the detected value correcting system 36. Specifically, the temperature T(K) of the substrate S is calculated on the basis of the Stefan-Boltzmann's formula $E=\sigma \cdot T^4$ ($\sigma$ is Stefan-Boltzmann's constant) in view of the emissivity $\epsilon (=1-\rho-\tau)$ defined by the reflectance $\rho$ and transmittance $\tau$ of the substrate S.

The procedure for carrying out the thermometry using the radiation thermometer 3 with such a construction will be described below.

First, during the non-measurement (correction) using the radiation thermometer 3, a reflector having a known reflectance is housed in the process vessel 1 in place of the substrate S, to be radiated with light emitted from the light emitting device 32 via the transparent window 2, and the detector 33 detects the intensity of the light reflected from the reflector. Then, the transmittance calculator 35 calculates the light transmittance $\gamma$ of the transparent window 2 on the basis of the intensity of the irradiation light emitted from the light emitting device 32, the reflectance of the reflector, and the intensity of the reflected light detected by the detector 33.

Then, during the measurement using the radiation thermometer 3, the detector 33 detects the quantity E of thermal radiation from the substrate S, and the detected value correcting system 36 corrects the quantity E of thermal radiation detected by the detector 33, using the light transmittance $\gamma$ calculated by the transmittance calculator 35.

Then, the temperature calculator 38 calculates the temperature T of the substrate S on the basis of the quantity E' of thermal radiation corrected by the detected value correcting system 36.

Actually, when a plurality of substrates (e.g., semiconductor substrates) S to be processed are continuously processed, reflectors (e.g., mirror substrates) are set to be fed at regular intervals between the substrates S sequentially fed into the process vessel 1. Then, assuming that the time when the reflector is fed in place of the substrate S is the above described non-measurement (correction) time, the above described thermometry procedure is carried out.

With the above-mentioned construction, the operation of this preferred embodiment will be described below. According to this preferred embodiment, since the thin-film deposition due to the action of the process gas can be inhibited in a portion, in which the micro holes 22 are formed on the internal surface 20 of the transparent window 2, the deterioration in the light transmittance of the transparent window 2 due to the thin-film deposition can be inhibited. Therefore, the precision of the optical thermometry for the substrate S using the radiation thermometer 3 can be held to be high.

In addition, even if the above described micro holes 22 are formed in the transparent window 2, it is difficult to completely prevent the deterioration in the light transmittance of the transparent window 2 due to the thin-film deposition. However, if the thermometry is carried out by means of the above described radiation thermometer 3 in view of the deterioration in the light transmittance of the transparent window 2, the precision of the thermometry of the substrate S can be held to be higher.

Incidentally, in place of the radiation thermometer 3, other optical measuring device may be used. As such measuring device, there are considered means for measuring the thickness of a thin film or the depth of etching for the substrate S by utilizing reflected light, means for detecting the end point of etching, and means for measuring particles in a process chamber utilizing the scattering of laser beams. Also in these cases, it is possible to hold a high measurement precision by utilizing the above described function of inhibiting the deterioration in the light transmittance of the transparent window 2 by the micro holes 22.

While the transparent window 2 has been provided in the wall portion of the process vessel 1, the transparent window may be provided in another portion, e.g., a gas supply portion (e.g., a shower head), for supplying a process gas into the process vessel 1.

In addition, the present invention can not only be applied to an optical measurement using a measuring device, but the invention can also be applied to a visual observation via the transparent window 2.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A vacuum process system comprising:
   a process vessel, provided with a transparent window, for carrying out a vacuum process for an object to be processed, which is housed therein, using a process gas; and a measuring device, arranged outside of said transparent window, for carrying out an optical measurement for said object in said process vessel via said transparent window, wherein a plurality of micro holes for inhibiting a thin-film deposition are formed in the internal surface of said transparent window facing the interior of said process vessel, wherein said plurality of micro holes do not entirely pass through said window.

2. A vacuum process system as set forth in claim 1, wherein each of said micro holes has a dimension so as to cause a microloading effect.

3. A vacuum process system comprising:

a process vessel, provided with a transparent window, for carrying out a vacuum process for an object to be processed, which is housed therein, using a process gas; and a measuring device, arranged outside of said transparent window, for carrying out an optical measurement for said object in said process vessel via said transparent window, wherein a plurality of micro holes for inhibiting a thin-film deposition are formed in the internal surface of said transparent window facing the interior of said process vessel, and wherein each of said micro holes has a diameter of 0.5 μm or less, and a ratio of a depth to said diameter of each of said micro holes is 5 or more.

4. A vacuum process system as set forth in any one of claims 1 through 3, wherein said measuring device is a radiation thermometer for measuring the temperature of said object.

5. A vacuum process system as set forth in claim 4, wherein said process vessel houses therein a reflector having a predetermined reflectance in place of said object during a correction during a non-measurement using said radiation thermometer, and said radiation thermometer comprises:

a light emitting device for emitting irradiation light for said reflector during said correction;

a detector for detecting the intensity of light reflected from said reflector for said irradiation light emitted from said light emitting device during said correction, and for detecting the quantity of thermal radiation from said object during a measurement;

a transmittance calculator for calculating a light transmittance of said transparent window on the basis of the intensity of said irradiation light emitted from said light emitting device, said reflectance of said reflector, and the intensity of said reflected light detected by said detector;

a detected value correcting system for correcting the quantity of thermal radiation detected by said detector, using said light transmittance calculated by said transmittance calculator; and a temperature calculator for calculating the temperature of said object on the basis of the quantity of thermal radiation corrected by said detected value correcting system.

* * * * *